United States Patent
Yang et al.

(10) Patent No.: US 7,026,963 B1
(45) Date of Patent: Apr. 11, 2006

(54) FAST LOOK-AHEAD PATH MODULATION APPARATUS

(75) Inventors: Yung-Chi Yang, Hsinchu (TW); Che-Kuo Hsu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/080,515

(22) Filed: Mar. 16, 2005

(30) Foreign Application Priority Data

Nov. 12, 2004 (TW) .............................. 93134814 A

(51) Int. Cl.
*H03M 5/00* (2006.01)

(52) U.S. Cl. .......................................... 341/58; 341/59
(58) Field of Classification Search ................. 341/51, 341/58, 59, 61, 67; 369/59.23, 59.24; 375/253, 375/286

See application file for complete search history.

(56) References Cited

U.S. PATENT DOCUMENTS

| | | | |
|---|---|---|---|
| 5,742,243 A * | 4/1998 | Moriyama .................... 341/59 |
| 5,917,857 A | 6/1999 | Tanaka et al. |
| 6,573,848 B1 * | 6/2003 | Hayami ........................ 341/68 |
| 6,639,525 B1 * | 10/2003 | Coene .......................... 341/59 |
| 6,696,991 B1 * | 2/2004 | Shim et al. .................... 341/58 |
| 6,737,996 B1 * | 5/2004 | Kurokawa et al. ............. 341/68 |
| 6,807,137 B1 * | 10/2004 | Chuang .................... 369/59.24 |
| 6,963,296 B1 * | 11/2005 | Oki et al. .................... 341/106 |
| 2005/0140526 A1* | 6/2005 | Yang et al. .................... 341/58 |

* cited by examiner

*Primary Examiner*—Linh V. Nguyen
(74) *Attorney, Agent, or Firm*—Rabin & Berdo, P.C.

(57) ABSTRACT

A fast look-ahead path modulation apparatus, used in a recording medium modulation apparatus, reduces computation time during its look-ahead path modulation procedure. It is based on different selection criteria of predetermined states, paths and characteristics of modulation. Accordingly, the apparatus drastically reduces the amount of computation in a regular look-ahead path modulation apparatus. It also reduces hardware costs of the recording medium modulation apparatus and increases efficiency.

17 Claims, 6 Drawing Sheets

FAST LOOK-AHEAD PATH MODULATION APPARATUS

FIELD OF THE INVENTION

The invention relates to a data modulation apparatus used in recording medium modulation apparatus, and more specifically to a modulation apparatus with the capability of setting selection criteria of different states, paths and modulation characteristics to reduce the amount of computation in the look-ahead path modulation procedure.

BACKGROUND OF THE INVENTION

Due to the physical characteristics of a recording device, the (d, k)-constrain of the Run-Length Limited (RLL) modulation used with a particular device have values within a particular design range. To design a modulation algorithm with certain (d, k)-constrain, the coding rate of this modulation algorithm has a theoretical maximum value. If the actual coding rate of this modulation algorithm is more closed to the theoretical maximum value, it is more efficiency. But we know that the coding rate will influence the capacity of recording medium. So that, many existing RLL modulation algorithms in this field aim to increase code efficiency. In general, these high efficiency modulation algorithms will reduce the number of selectable codeword and the available choices of paths, and then reducing the ability of DC-free control.

To improve the ability of DC-free control, one possible method is to use a look-ahead path modulation, which calculates several data words, then determines the most suitable codewords for modulation corresponding to the foremost data word; therefore, the longer the pre-calculated look-ahead path, the better the ability of DC-free control. However, this kind of modulation increases calculations exponentially when the length of the look-ahead path increases, thus reducing overall modulation speed.

Because a high efficiency modulation requires the look-ahead path modulation to increase the ability of DC-free control, and how to reducing the calculations required for look-ahead path modulation and increasing the modulation speed has become a major focus for many research projects. U.S. Pat. No. 5,917,857 provides a recording medium modulation apparatus for EFM and EFMPlus modulation, but it is based on DVD specifications and is only suitable for a specified DC-free control method, not for a fixed length look-ahead path modulation.

Because the look-ahead path modulation has become very popular, a more efficient look-ahead algorithm that can be implement in the hardware is needed. How to increase the execution efficiency and to decrease the cost of hardware by reducing the calculation in the look-ahead path modulation procedure is very important.

SUMMARY OF THE INVENTION

The invention provides a fast look-ahead path modulation apparatus, primarily used in a recording medium modulation apparatus. By using selected criteria of different states, paths and modulation characteristics, the system can quickly eliminate unusable paths in a look-ahead path modulation and select the best path among the remaining paths. Therefore, it reduces the number of calculations required in a fixed length look-ahead path modulation.

In addition, a fast look-ahead path modulation apparatus uses memory for buffering data during calculations. The invention utilizes a two-stage process for eliminating unusable paths and selecting an optimal path:

(1) Based on the first set of selection criteria of predetermined different states and paths, it eliminates unusable paths among available paths, reduces the number of possible paths and stores these possible paths for the second selection process.

(2) Based on a second set of selecting criteria of different modulation characteristics, it further eliminates non-optimal paths from among the remaining paths, finds the best path for modulation and determines the final optimal output codeword.

Hence, the invention increases calculations linearly for the look-ahead path modulation when increasing the length of look-ahead path, and improves the speed of the look-ahead path modulation in a recording medium modulation apparatus.

The invention can be used in EFMPlus modulation specified in DVD standard, EFTCM modulation specified in FVD standard after state-control technology is added, or in other kinds of modulation.

BRIEF DESCRIPTION OF THE DRAWING

Other objects, features, and advantages of the invention will become apparent from the following detailed description of the preferred but non-limiting embodiment. The description is made with reference to the accompanying drawings in which.

DETAILED DESCRIPTION OF THE INVENTION

Figure 1:
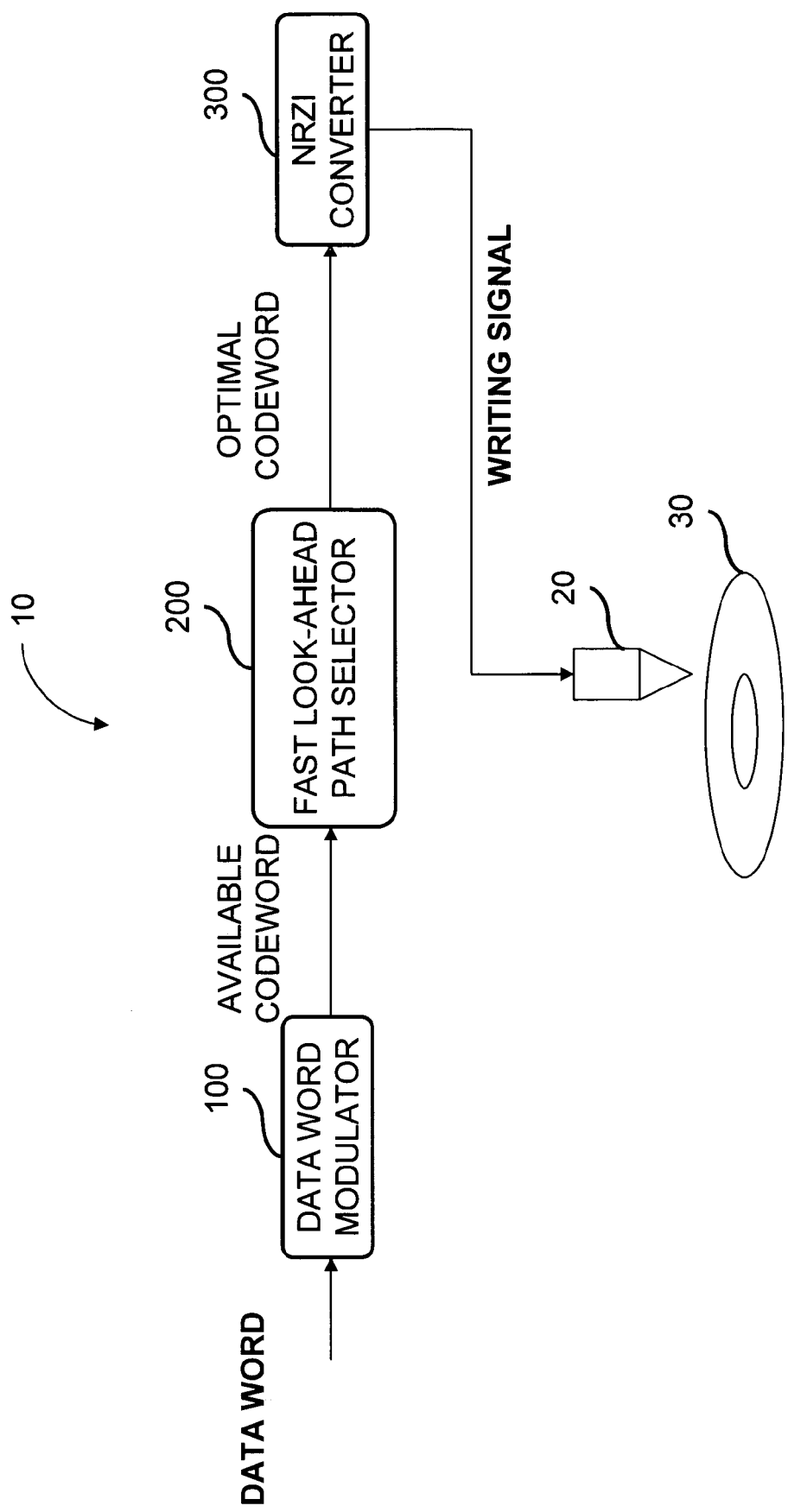
FIG. 1 is a block diagram of a recording medium modulation apparatus of the invention.

FIG. 1 is a block diagram of a recording medium modulation apparatus 10 with a fast look-ahead path modulation of the invention. The main components of the fast look-ahead path modulation apparatus include a data word modulator 100 and a fast look-ahead path selector 200 in the recording medium modulation apparatus 10.

The whole algorithm of the recording medium modulation apparatus 10 is as follows: first, transfer data words, which will be stored in the recording medium 30, to the data word modulator 100. These data words are converted into corresponding available codewords and then these codewords are forwarded to the fast look-ahead path selector 200. The fast look-ahead path selector 200 selects a series of optimal codewords form the input series of available codewords based on different selection criteria related to predetermined states, paths and modulation characteristics. The optimal codewords are transferred to a signal converter 300 to be converted into recordable writing signal, which is in Non-Return-to-Zero (NRZI) format. Finally, this signal is written on the recording medium 30 by a pickup head 20.

Figure 2:
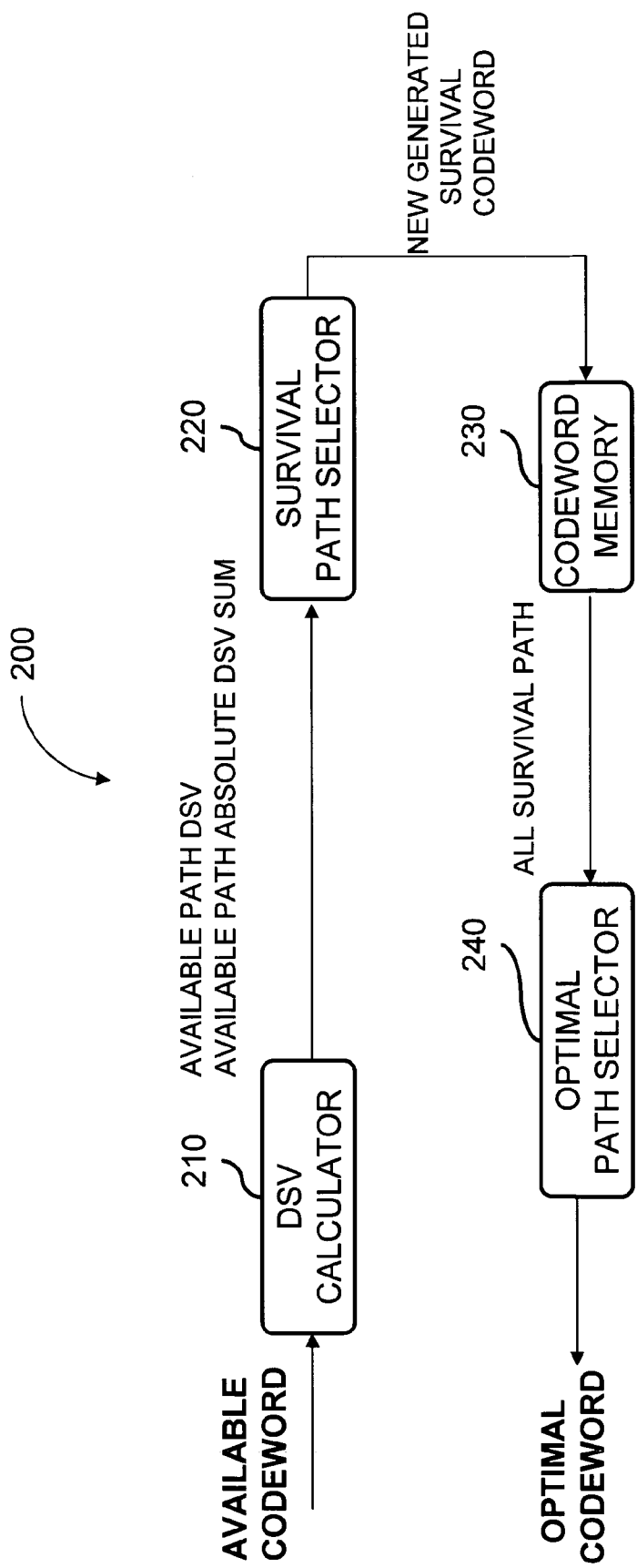
FIG. 2 is a functional block diagram of a fast look-ahead path selector of the invention.

FIG. 2 is a functional block diagram of the fast look-ahead path selector 200. The fast look-ahead path selector 200 receives the available codewords from the data word modulator 100. First, the DSV calculator 210 calculates every new path DSV and the sum of absolute path DSV of the new available paths, where are combined available codewords with corresponding survival paths previously stored in a buffer. They are then sent to the survival path selector 220 for first path selection, based primarily on a predetermined first set of selection criteria (states and paths) to determine survival paths. Meantime, the available paths except survival paths are eliminated in order to reduce buffering data; at the same time, newly generated survival codewords in the survival paths are sent to the codeword memory 230. When reaching a predetermined look-ahead length (i.e., look-ahead path calculation of predetermined fixed length), all survival paths in the buffer are processed by the optimal path selector 240 for second path selection, based primarily on a predetermined second set of selection criteria (modulation characteristics) to determine a optimal path. The optimal path selector 240 outputs the optimal codeword, which is the foremost codeword of the optimal path. Lastly, through an NRZI converter 300, the optimal codeword is converted and recorded to the recording medium 30.

Figure 3A:
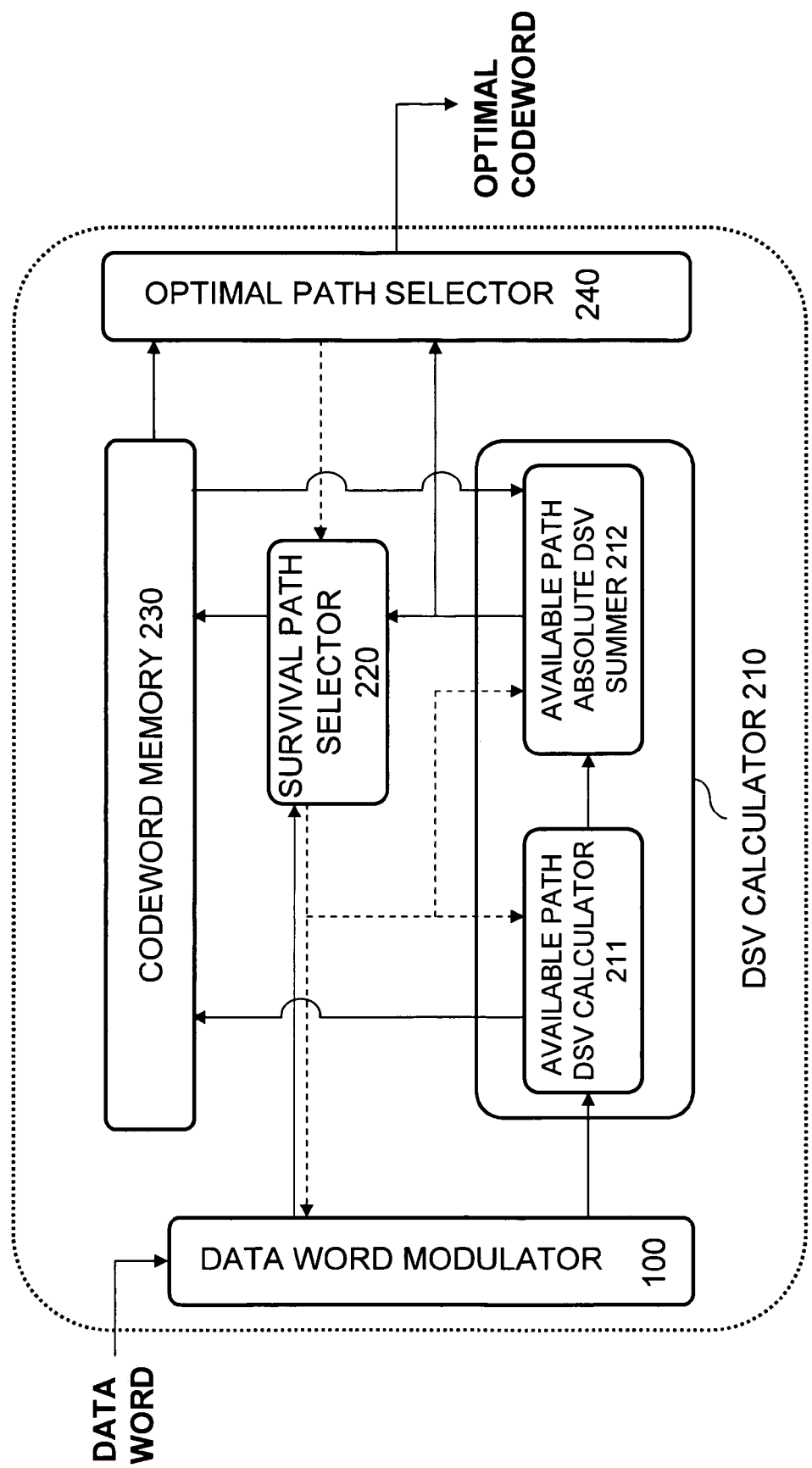
FIG. 3A is a functional block diagram of the first embodiment of the invention.
Figure 3B:
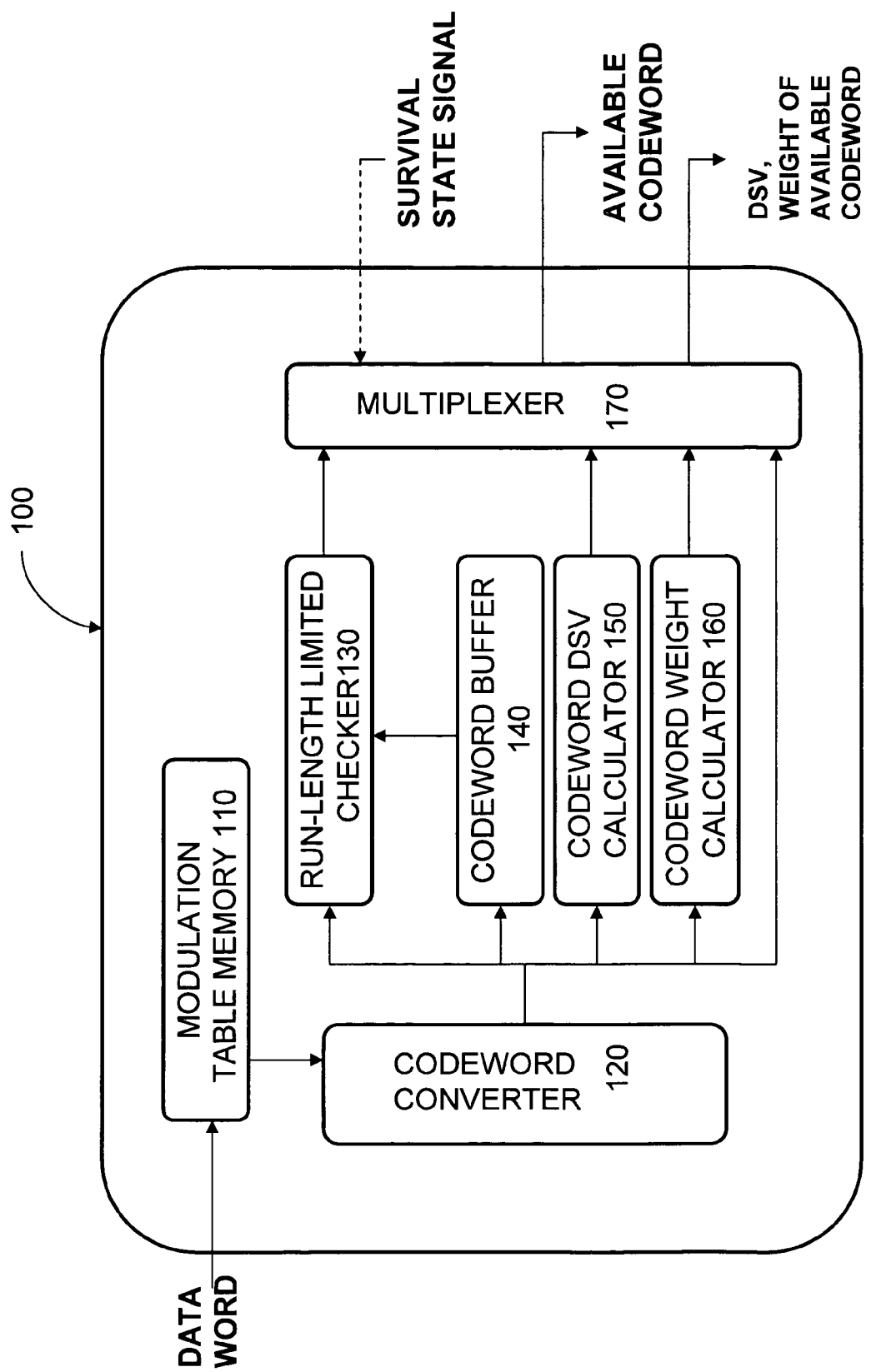
FIG. 3B is a functional block diagram of a data word modulator in the first embodiment of the invention.

Refer to FIG. 3A, which is a functional diagram of the first embodiment, comprising:

(1) The data word modulator 100, which is responsible for converting outside input data words to more than one available corresponding codeword. It calculates characteristic values of each available codeword, including the digital sum value (DSV) and the weight (i.e., the number of "1" in codeword is odd or even), which will be used by the fast look-ahead path selector 200 for calculating path DSV. The detailed functional block diagram is shown in FIG. 3B, which includes:

(a) A modulation table memory 110, normally a ROM, for storing the modulation table, which is used to convert a data word into more than one corresponding simplified codeword, and storing the simplified SYNC codeword table, which is used to find out the simplified SYNC codeword when receiving a SYNC signal from a counter (not shown in the Fig.).

In order to reduce the area of the modulation table memory 110, whole table comprises simplified codeword and simplified SYNC codeword instead of codeword and SYNC codeword.

(b) A codeword converter 120, which is primarily responsible for restoring the simplified codeword or the simplified SYNC codeword, from output of the modulation table memory 110, to an original codeword or SYNC codeword (if the content in the table is not simplified, the codeword converter 120 may not be used).

The following function block processes each codeword obtained:

(c) A run-length limited checker 130, which makes an RLL check to ensure the codeword from the codeword converter 120 still complies with the (d, k)-constrain limit after linking with a previous codeword from the codeword buffer 140.

(d) A codeword buffer 140, which temporarily stores codewords previously generated by the codeword converter 120, and provides the run-length limited checker 130 with these codewords when the run-length limited checker 130 requests in order to ensure linked codeword legitimacy.

(e) A codeword DSV calculator 150, which is responsible for receiving each codeword from the codeword converter 120, and performing DSV calculations on the codeword.

(f) A codeword weight calculator 160, which receives each codeword from the codeword converter 120, and performs weight calculations on the codeword.

(g) A multiplexer 170, which receives the results generated by the codeword converter 120, the run-length limited checker 130, the codeword DSV calculator 150 and the codeword weight calculator 160. Depending on the survival state signal generated by the survival path selector 220 after its previous modulation decides each survival codeword, the multiplexer determines each legitimate codeword (i.e. available codeword) which can be linked up to each survival path, output DSV, weight of each available codeword to the DSV calculator 210, and each available codeword to the survival path selector 220.

(2) A DSV calculator 210, which receives the DSV and weight of available codewords from the multiplexer 170 of the data word modulator 100, then processes them to calculation the characteristics of each available paths, includes:

(a) An available path DSV calculator 211, which calculates each available path's DSV from the DSV and weight from the multiplexer 170.

(b) An available path absolute DSV summer 212, which receives each available path DSV calculated by the available path DSV calculator 211; it takes the absolute value of each available path DSV and then adds them up, i.e., calculates each available path's absolute DSV sum.

(3) A survival path selector 220, which makes the first selection based on each available path's absolute DSV sum using the first set of selection criteria (i.e. states and paths) and decides the survival paths and each survival codeword among available codewords received from the data word modulator 100.

(4) A codeword memory 230, which stores more than one survival codeword and the corresponding survival path DSV after confirming the survival paths.

(5) An optimal path selector 240; when the content of the codeword memory 230 reaches a predetermined modulation length (i.e. reaching look-ahead calculation of a predetermined fixed length), it performs the second selection process based on the absolute DSV sum corresponding to each survival path stored in the codeword memory 230using the second set of selecting criteria to determine the optimal path, and chooses the optimal codeword among the received foremost codewords of survival paths for output.

When the survival path selector 220 decides each desirable survival codeword, it generates a survival state signal to the data word modulator 100 as a base for the next data word modulation, and sends the signal to the available path DSV calculator 211 so that each available path DSV corresponding to each survival codeword (i.e. survival path DSV) is stored in the codeword memory 230. At the same time, it cleans the unusable paths unrelated to the survival path in the memory. Also, the survival state signal is sent to the available path absolute DSV summer 212 for cleaning contents unrelated to the survival path.

Furthermore, when the survival paths of codeword memory 230 accumulates to a predetermined look-ahead length, it sends each foremost codeword corresponding to each survival path to the optimal path selector 240 for selecting each corresponding available path absolute DSV sum (i.e. survival path absolute DSV sum) in order to determining an optimal codeword. And the codeword memory 230 sends each foremost survival path DSV corresponding to each survival path in the memory to the available path absolute DSV summer 212, so that when calculating the next absolute DSV sum, after deducting each survival path's foremost survival path DSV, each available path absolute DSV sum only involves each survival path DSV with the corresponding modulation path in the codeword memory 230.

The invention of the fast look-ahead path modulation apparatus has a process, in which after the optimal path selector 240 decides the optimal codeword, the codeword memory 230 automatically deletes certain survival paths which their foremost codeword is different from the optimal path. It is then ready for the next data word modulation.

In addition, the invention utilizes a counter (not shown) for SYNC control, which sends a SYNC signal to the modulation table memory 110 in the data word modulator 100 at predetermined intervals so that an SYNC codeword will be inserted at proper intervals during the modulation. The overall processing control is maintained by a timing controller (not shown) to coordinate interaction among function blocks.

The second embodiment will be explained with FIGS. 4A and 4B. It differs from the first embodiment by keeping only survival codeword number after the survival paths are decided in order to reduce the size of the codeword memory 230. The codeword number is automatically assigned according to more than one codeword, which are found out depended on the data word in the modulation table, during the first calculation period. During the second calculation period, the codeword can be recalled with the codeword number. In order to evaluate the survival path DSV that is stored in the codeword memory 230 in first embodiment, an extra data word buffer memory 270 is required to re-generate the available codeword, its DSV and its weight corresponding to the foremost data word.

In the second embodiment, each modulation requires two periods; in first period, the generated available codeword, the DSV and the weight are used only for the first selection; after the survival paths are confirmed, each survival codeword number is stored in the codeword memory 230 so that during the second calculation period, using the survival codeword and its corresponding DSV and weight regenerated from the codeword number, the second selection can select the optimal path and decide the optimal codeword.

Figure 4A:
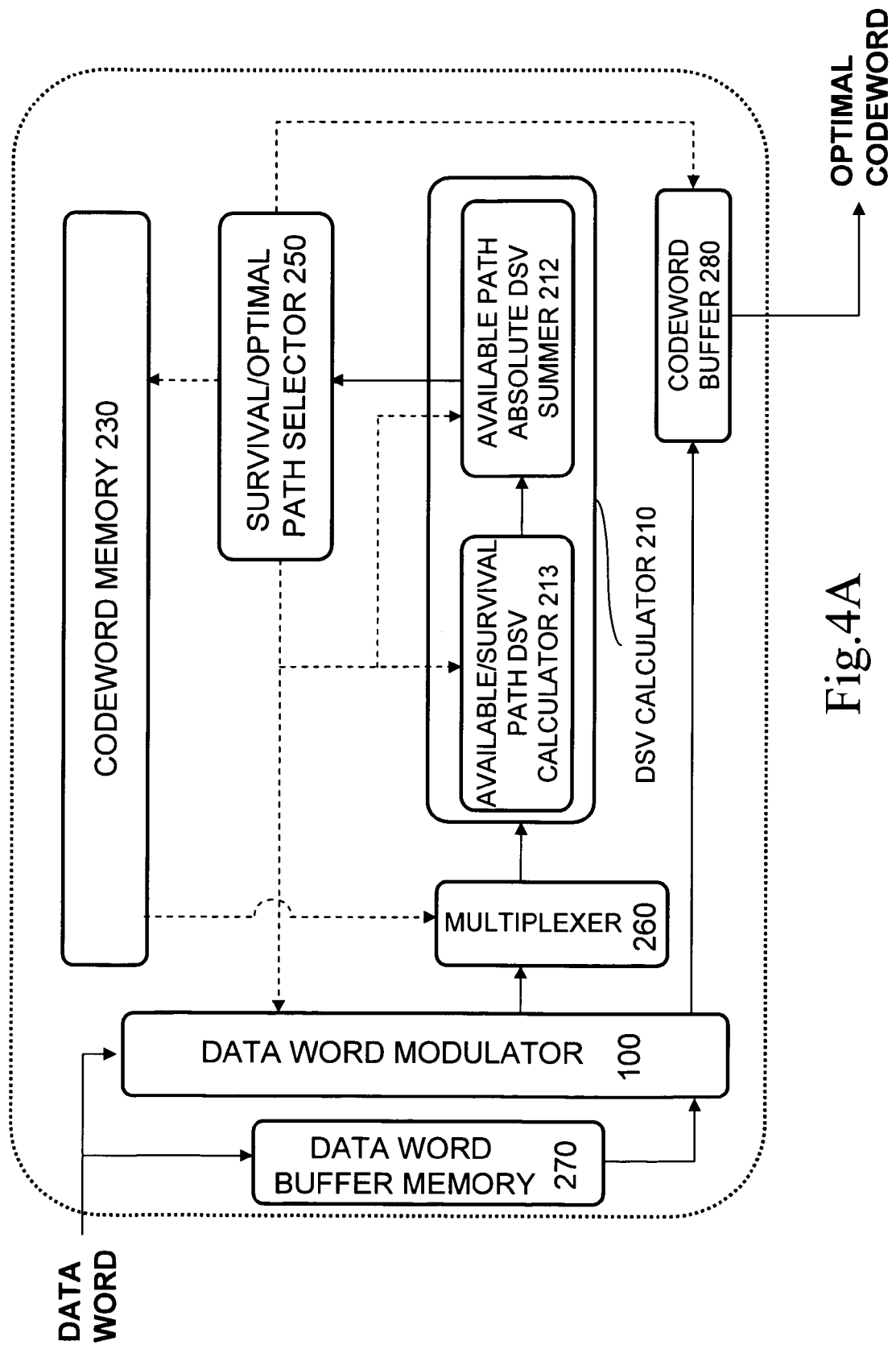
FIG. 4A is a functional block diagram of a second embodiment of the invention.
Figure 4B:
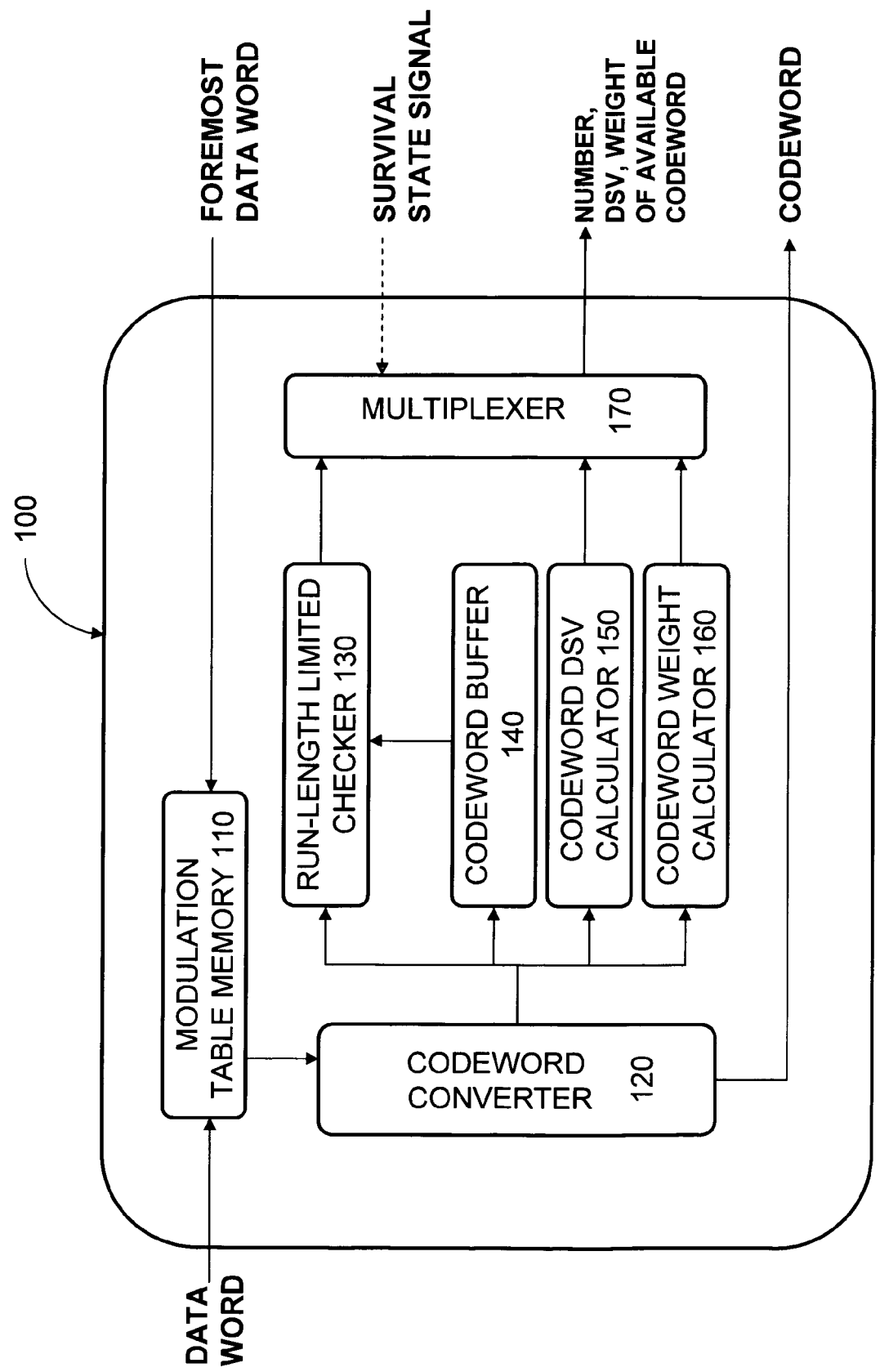
FIG. 4B is a functional block diagram of a data word modulator in the second embodiment of the invention.

FIG. 4A is a detailed functional block diagram of second embodiment, which includes:

(1) A data word modulator 100, which, during the first calculation period, converts an input data word into more than one corresponding available codeword, and calculates and outputs each available codeword number, its DSV and its weight. Also, during the second calculation period, it receives the foremost data word previously stored in the data word buffer memory 270 (The buffered length is related to the given look-ahead length) and again converts the data word to more than one corresponding codeword and number, DSV and weight to output. Its detailed functional block diagram is shown in FIG. 4B, which includes:

(a) A modulation table memory 110, which is normally a ROM, and is responsible for storing a modulation table which is used to convert a data words into more than one simplified codeword, and storing a simplified SYNC control codeword table, which is used to search for the simplified SYNC codeword when receiving the SYNC control signal from the counter (not shown) during the first calculation period. Also, it can be used to search for the simplified codeword corresponding to the foremost data word received from the data word buffer memory 270 during the second calculation period.

This embodiment of the modulation table memory 110 is the same as the first embodiment, in which to reduce the size of ROM, the codeword in the modulation table or the SYNC control codeword is simplified before being stored, and reconverted when needed.

(b) A codeword converter 120, which is used to reconvert the simplified codeword from the modulation table memory 110 or the simplified SYNC control codeword to original form (if the contents in the modulation table memory 110 are not simplified, this part can be omitted).

(c) A run-length limited checker 130, which makes an RLL check to ensure the codeword from the codeword convert 120 complies with (d, k)-constrain limits after it links to a previous connectible codeword from the codeword buffer 140.

(d) A codeword buffer 140, which is used for temporarily storing each codeword previously generated by the codeword converter 120, and automatically providing every previous codeword to the run-length limited checker 130 when it requests, to ensure the linked codeword is usable.

(e) A codeword DSV calculator 150, which is responsible for receiving each codeword from the codeword converter 120, and calculating the codeword DSV.

(f) A codeword weight calculator 160, which receives each codeword from the codeword converter 120, and calculates the codeword weight.

(g) A multiplexer 170, which receives the output results from the run-length limited checker 130, the codeword DSV calculator 150 and the codeword weight calculator 160 during the first calculation period. Depending on the survival state signal decided previously by the survival/optimal path selector 250, the multiplexer determines the codeword number of each available codeword, its DSV and its weight as output to the DSV calculator 210.

In addition, during the second calculation period the multiplexer 170 receives the output results from the codeword DSV calculator 150 and the codeword weight calculator 160, and sends the codeword number, its DSV and its weight corresponding to the foremost data word from the data word buffer memory 270 to the DSV calculator 210.

After the survival/optimal path selector 250 determines each survival codeword number during the first calculation period, it sends a survival state signal to the multiplexer 170 so that it can continue to modulate data word during the next first calculation period.

This data word modulator 100 sends each output codeword from the codeword converter 120 to the codeword buffer 280 during second calculation period. (At this time, data word comes from the data word buffer memory 270)

(2) A DSV calculator 210, which is used for processing each available codeword number, DSV and weight of the data word output from the multiplexer 170 of data word modulator 100, further includes:
 (a) An available/survival path DSV calculator 213, which is used for calculating each available path DSV, depending on each available codeword DSV and its weight during the first calculation. Based on the foremost codeword number corresponding to each survival path, it calculates the foremost survival path DSV of each survival path during the second calculation period.
 (b) An available path absolute DSV summer 212, which is used for calculating each available path absolute DSV sum, based on each available path DSV from the available/survival path DSV calculator 213 during the first calculation period. It re-calculates each available path absolute DSV sum based on the foremost survival path DSV corresponding to each survival path from the available/survival path absolute DSV calculator 213 during the second calculation period.
(3) A codeword memory 230, which is used for storing each survival codeword number output from the survival/optimal path selector 250 during the first calculation period; it also automatically provides the foremost codeword number corresponding to each survival path to the available/survival path DSV calculator 213 during the second calculation period.
(4) An survival/optimal path selector 250, which is used for making selections on each received available path absolute DSV sum based on the first set of selection criteria during the first calculation period and deciding the survival codeword number among each received available codeword number (i.e. deciding the survival path), and making selections again on each survival path absolute DSV sum, which is selected at the first calculation period, based on the second set of selection criteria during the second calculation period, to determine an optimal codeword number (i.e. deciding the optimal path).
(5) A data word buffer memory 270, which is used for temporarily storing the input data word into the memory during the first calculation period. The buffer length is related to the given look-ahead length. And it sends the foremost data word to the data word modulator 100 during the second calculation period.
(6) A codeword buffer 280, which is used for receiving each available codeword from the codeword converter 120 of the data word modulator 100 during the second calculation period. When the survival/optimal path selector 250 decides the optimal codeword number during the second calculation period, it sends it directly to the codeword buffer 280 in order to determine the optimal codeword as output.

In the second embodiment, a multiplexer 260 can be added in between the data word modulator 100 and the DSV calculator 210, which is responsible for receiving each output available codeword number, its DSV and its weight from the multiplexer 170 of the data word modulator 100 during the first calculation period. In addition, during the second calculation period, it receives the foremost codeword number corresponding to the survival paths sent by the codeword memory 230, decides the DSV and the weight of each corresponding codeword number, and sends it to the DSV calculator 210.

Also, this embodiment includes an automatic clean and update process. When the available/optimal path selector 250 decides the survival codeword number during the first calculation period, it send a survival state signal to the data word modulator 100, the available/survival path DSV calculator 213 and the available path absolute DSV summer 212, to clean up temporary content of unrelated survival paths and update with new data. Moreover, after the optimal codeword number is determined during the second calculation period, the codeword memory 230 automatically cleans certain survival paths that their foremost codeword number is different from the optimal path.

As for the SYNC control, this embodiment utilizes a counter (not shown) to generate an SYNC control signal to the modulation table memory 110 of the data word modulator 100 at predetermined time intervals so that the SYNC control codeword can be inserted at the proper times during the modulation. The whole process control of this embodiment can be maintained by a timing controller (not shown) to coordinate interactions among function blocks.

To comply with the EFTCM modulation of the FVD standard, this embodiment adds a type control codeword table in the data word modulator 100. When it receives a type control signal produced at predetermined time intervals, it inserts a type control codeword at proper times during the modulation process.

The fast look-ahead path modulation apparatus of the invention, as mentioned in the above two embodiments, can not only be used for the EFMPlus modulation of the DVD standard, but also for the EFTCM modulation of the FVD standard, and even for other look-ahead modulation algorithm with the fixed look-ahead length. The invention requires less hardware to process modulation and achieves equal or higher modulation speed relative to the existing recording medium modulation apparatuses.

Although the invention has been fully described in connection with the preferred embodiments thereof with reference to the accompanying drawings, it is to be noted that various changes and modifications will be apparent to those skilled in the art. Such changes and modifications are to be understood as included within the scope of the invention as defined by the appended claims.

What is claimed is:
1. A fast look-ahead path modulation apparatus using criteria, such as states, paths and modulation characteristics for modulation in a look-ahead path calculation process, comprising:
 a data word modulator, which converts a received data word to more than one corresponding available codewords, and output a digital sum value (DSV) and a weight of each available codeword;
 a codeword memory, which stores more than one survival codewords and corresponding DSVs after a selection process, and updates the contents of the codeword memory after an optimal codeword is produced and outputted;
 a DSV calculator comprising:
  an available path DSV calculator for calculating each available path DSV based on the DSV and the weight of each available codeword; and
  an available path absolute DSV summer for receiving each available path DSV and calculating an available path absolute DSV sum;
 a survival path selector, which selects the available path absolute DSV sum based on a first set of selecting criteria, and determines each survival codeword among the received available codewords; and
 an optimal path selector, which selects a foremost codeword of each received survival path and the corresponding available path absolute DSV sum based on a second set of selecting criteria, and decides an optimal modulation codeword to output, wherein when the survival path selector decides each survival codeword, a survival state signal is generated and sent to the data word modulator for the next data word modulation to process and to the available path DSV calculator for storing the survival path DSV corresponding to each survival codeword into the codeword memory, and then updating the available path DSV calculator and the survival path absolute DSV summer, wherein when the content of the codeword memory accumulates to a designed look-ahead length, the codeword memory sends the foremost codeword corresponding to the each survival path to the optimal path selector where the optimal modulation codeword is selected based on the sum of each survival path absolute DSV, and the codeword memory sends the sum of the survival path absolute DSV corresponding to the foremost codeword of the each survival path to the available path absolute DSV summer.

2. The fast look-ahead path modulation apparatus as claimed in claim 1, wherein the first set of selecting criteria comprises dividing all available path DSVs into two groups, either a positive state or a negative state; comparing the available path absolute DSV sums among these available path DSVs and selecting two available path DSV having the least absolute DSV sum in each group; and assigning the corresponding available path as the survival path; and assigning the corresponding available codeword as the survival codeword.

3. The fast look-ahead path modulation apparatus as claimed in claim 1, wherein the second set of selecting criteria is that after comparing each survival path absolute DSV sums, where a smallest sum is an optimal path and corresponding survival codeword is the optimal codeword.

4. The fast look-ahead path modulation apparatus as claimed in claim 1, further comprising a counter for generating a SYNC control signal to the data word modulator at a first designed time intervals, which adds a SYNC control codeword in the modulation process.

5. The fast look-ahead path modulation apparatus as claimed in claim 1, further comprising a timing controller to control operation process.

6. The fast look-ahead path modulation apparatus as claimed in claim 1, wherein the data word modulator comprises:
a modulation table memory for storing a modulation table of more than one simplified codewords corresponding to the data word, and storing a simplified SYNC control codeword table, searching for the simplified SYNC control codeword when a SYNC control signal is received or searching for each corresponding simplified codeword when the data word is received;
a codeword converter for receiving each simplified available codeword or each simplified SYNC control codeword and to convert them back to original codeword and SYNC control codeword;
a codeword buffer for temporarily storing each codeword;
a run-length limited checker for making run-length check on the codewords from the codeword buffer linked to codewords from the codeword converter after receiving;
a codeword DSV calculator for receiving each codeword from the codeword converter and making each codeword DSV calculation;
a codeword weight calculator for making weight calculation on the codeword received from the codeword converter; and
a multiplexer for receiving results from the codeword converter, the run-length limited checker, the codeword DSV calculator and the codeword weight calculator and sending out each available codeword, corresponding DSV and weight,
wherein when the survival path selector determines each survival codeword, the multiplexer receives the survival state signal for processing next data word modulation.

7. The fast look-ahead path modulation apparatus as claimed in claim 6, wherein the data word modulator comprises a type control codeword table for receiving a type control signal to provide a type control codeword to be added to the available codeword at a second designed time intervals.

8. A fast look-ahead path modulation apparatus using criteria of states, paths and modulation characteristics for modulation in a look-ahead path calculation process, comprising:
a data word modulator for converting a data word to more than one corresponding available codewords during a first calculation period, and calculating a codeword number, a digital sum value (DSV) and a weight corresponding to each available codeword as output during the first calculation period, and after a foremost data word is received, the modulator converts the foremost data word to more than one corresponding codewords and outputs the codeword numbers, the DSVs and the weights during a second calculation period;
a data word buffer memory for storing data word during the first calculation period, and sending the foremost data word to the data word modulator during the second calculation period;
a DSV calculator, comprising:
an available/survival path DSV calculator for calculating each available path DSV based on each available codeword DSV and the weight during the first calculation period, and calculating the corresponding foremost survival path DSV based on the foremost codeword number corresponding to each survival path during the second calculation period; and
an available path absolute DSV summer for calculating the sum of each available path absolute DSV based on available path DSV and the weight during the first calculation period, and re-calculating each available path absolute DSV sum based on the foremost survival path DSV of each survival path during the second calculation period;
a survival/optimal path selector for making selection on the sum of each received available path absolute DSV based on the first set of selecting criteria during the first calculation period, and for deciding survival codeword numbers among received corresponding available codeword numbers, also for selecting an sum of each survival path absolute DSV after the first calculation period based on the second set of selecting criteria, and for determining an optimal codeword number during the second calculation period;
a codeword memory for storing each survival codeword number during the first calculation period, and for providing the foremost codeword number corresponding to each survival path during the second calculation period; and a codeword buffer for receiving each codeword from the data word modulator during the second calculation period, wherein when the survival/optimal path selector decides each survival codeword number, a survival state signal is generated to the data word modulator, available/survival path DSV calculator and available path absolute DSV summer for updating process;

wherein when the survival/optimal path selector decides the optimal codeword number, the optimal codeword number is sent to the codeword buffer to determine an optimal codeword as output.

9. The fast look-ahead path modulation apparatus as claimed in claim 8, further comprising a multiplexer connected to the data word modulator and the codeword memory and the DSV calculator, wherein the multiplexer receives each available codeword number and weight from the data word modulator during the first calculation period and sends to the available/survival path DSV calculator, and the multiplexer receives the foremost codeword number corresponding to each survival path from the codeword memory and then sends the codeword DSV corresponding to each foremost codeword number to the available/survival path DSV calculator during the second calculation period.

10. The fast look-ahead path modulation apparatus as claimed in claim 8, wherein the first calculation period is a time period needed to finish all the modulation operation from a data word to each survival codeword number being stored in the codeword memory.

11. The fast look-ahead path modulation apparatus as claimed in claim 8, wherein the second calculation periods is a time period needed to complete all the modulation operation from the each survival codeword number to the optimal codeword output.

12. The fast look-ahead path modulation apparatus as claimed in claim 8, wherein the first set of selecting criteria comprises dividing all available path-DSVs into two groups, either a positive state or a negative state, comparing the available path absolute DSV sums among these available path DSVs and selecting two available path DSV having the least absolute DSV sum in each group, and assigning the corresponding available path as the survival path, and assigning the corresponding available codeword as the survival codeword.

13. The fast look-ahead path modulation apparatus as claimed in claim 8, wherein the second set of selecting criteria is to pick a smallest value as an optimal path based on comparison among the sums of all survival path absolute DSVs, and assigning the corresponding survival codeword is the optimal codeword.

14. The fast look-ahead path modulation apparatus as claimed in claim 8, further comprising a counter for generating a SYNC control signal to the data word modulator at a first designed time intervals, which adds a SYNC control codeword in the modulation process.

15. The fast look-ahead path modulation apparatus as claimed in claim 8, further comprising a timing controller for controlling operation process.

16. The fast look-ahead path modulation apparatus as claimed in claim 8, wherein the data word modulator comprises:

a modulation table memory for storing a modulation table of more than one simplified codewords corresponding to the data word, and storing a simplified SYNC control codeword table, searching for the simplified SYNC control codeword when SYNC control signal is received; or searching for corresponding each simplified codeword when the data word is received, in addition, searching for each simplified codeword corresponding to the data word when the foremost data word is received during the second calculation period;

a codeword converter for converting each simplified codeword and the simplified SYNC control codeword back to original codeword and SYNC control codeword;

a codeword buffer for temporarily storing each codeword;

a run-length limited checker for making run-length check on the codewords from the codeword buffer linked to codewords from the codeword converter after receiving;

a codeword DSV calculator for receiving each codeword from the codeword converter and making each codeword DSV calculation;

a codeword weight calculator for making weight calculation on the codeword received from the codeword converter; and a multiplexer for receiving results from the codeword converter, the run-length limited checker, the codeword DSV calculator and the codeword weight calculator and sending out the codeword number, DSV and weight corresponding to each available codeword during the first calculation period, also receiving results from the codeword DSV calculator and the codeword weight calculator and outputs the codeword number, DSV and weight corresponding to each codeword of the foremost data word during the second calculation period, wherein the data word converter outputs each codeword corresponding to the foremost data word during the second calculation period, wherein when the survival/optimal path selector determines each survival codeword number during the first calculation period, the multiplexer receives the survival state signal for processing next data word modulation.

17. The fast look-ahead path modulation apparatus as claimed in claim 16, wherein the data word modulator comprises a type control codeword table for receiving a type control signal to provide a type control codeword to be added to the available codeword at a second designed time intervals.

* * * * *